United States Patent
Kempf

(10) Patent No.: US 6,531,971 B2
(45) Date of Patent: Mar. 11, 2003

(54) METHOD FOR MONITORING INFORMATION DENSITY AND COMPRESSING DIGITIZED SIGNALS

(76) Inventor: Achim Kempf, 4440 S.W. Archer Rd., #521, Gainesville, FL (US) 32608

( * ) Notice: Subject to any disclaimer, the term of this patent is extended or adjusted under 35 U.S.C. 154(b) by 0 days.

(21) Appl. No.: 09/854,860

(22) Filed: May 14, 2001

(65) Prior Publication Data

US 2001/0050953 A1 Dec. 13, 2001

Related U.S. Application Data

(60) Provisional application No. 60/204,174, filed on May 15, 2000.

(51) Int. Cl.[7] ............................ H03M 7/34; H03M 7/38; H03M 7/46
(52) U.S. Cl. ............................................. 341/63; 341/51
(58) Field of Search .............................. 341/51, 61, 63, 341/67, 60; 327/113; 348/400.1; 375/240; 704/200; 378/4

(56) References Cited

U.S. PATENT DOCUMENTS

| | | | |
|---|---|---|---|
| 4,370,643 A | 1/1983 | Kitamura et al. | 341/123 |
| 4,568,912 A | 2/1986 | Kitamura et al. | 704/265 |
| 4,626,827 A | 12/1986 | Kitamura et al. | 341/110 |
| 4,755,795 A * | 7/1988 | Page | 341/51 |
| 4,763,207 A | 8/1988 | Podolak et al. | 360/32 |
| 4,816,829 A | 3/1989 | Podolak et al. | 341/122 |
| 4,899,146 A | 2/1990 | Podolak et al. | 341/51 |
| 5,225,787 A * | 7/1993 | Therssen | 327/113 |
| 5,302,950 A | 4/1994 | Johnson et al. | 341/123 |
| 5,388,181 A | 2/1995 | Anderson et al. | 704/200.1 |
| 5,512,895 A * | 4/1996 | Madden et al. | 341/61 |
| 5,610,825 A | 3/1997 | Johnson et al. | 702/76 |
| 5,893,899 A | 4/1999 | Johnson et al. | 702/76 |

* cited by examiner

*Primary Examiner*—Patrick Wamsley

(57) ABSTRACT

The invention relates to compressing and decompressing digitized analogue signals, such as speech or music, by continuously adjusting the sampling rate to the time-varying information density of any given signal. The invention consists of three main parts: 1) a technique for measuring the time-varying information density of the signal, utilizing a line search for the optimal time-varying rate. 2) a technique for compressing and decompressing the signal by digitally resampling the signal from a constant high rate to a time-variable lower rate that follows the measured time-varying information density in the signal, and 3) a technique for decompression by resampling back to a constant high rate. The preferred embodiment utilizes a generalization of the cardinal series reconstruction kernel which is directly expressed in terms of the varying sampling rate. Thus, while prior art utilizes block-wise constant sampling rates, which necessarily lead to uncontrolled artifacts at block boundaries, the new invention entirely avoids this problem and allows fully controlled signal reconstruction from truly continuously time-varying optimally low sampling rates. The invention therefore has the advantage of allowing a much closer match of the sampling rate to the variable information density of the signal, thereby maximizing the sampling efficiency. The invention also provides a new technique for monitoring changes of signal characteristics, e.g. for diagnostic purposes, namely by continuously measuring the time-varying information density of signals.

11 Claims, 11 Drawing Sheets

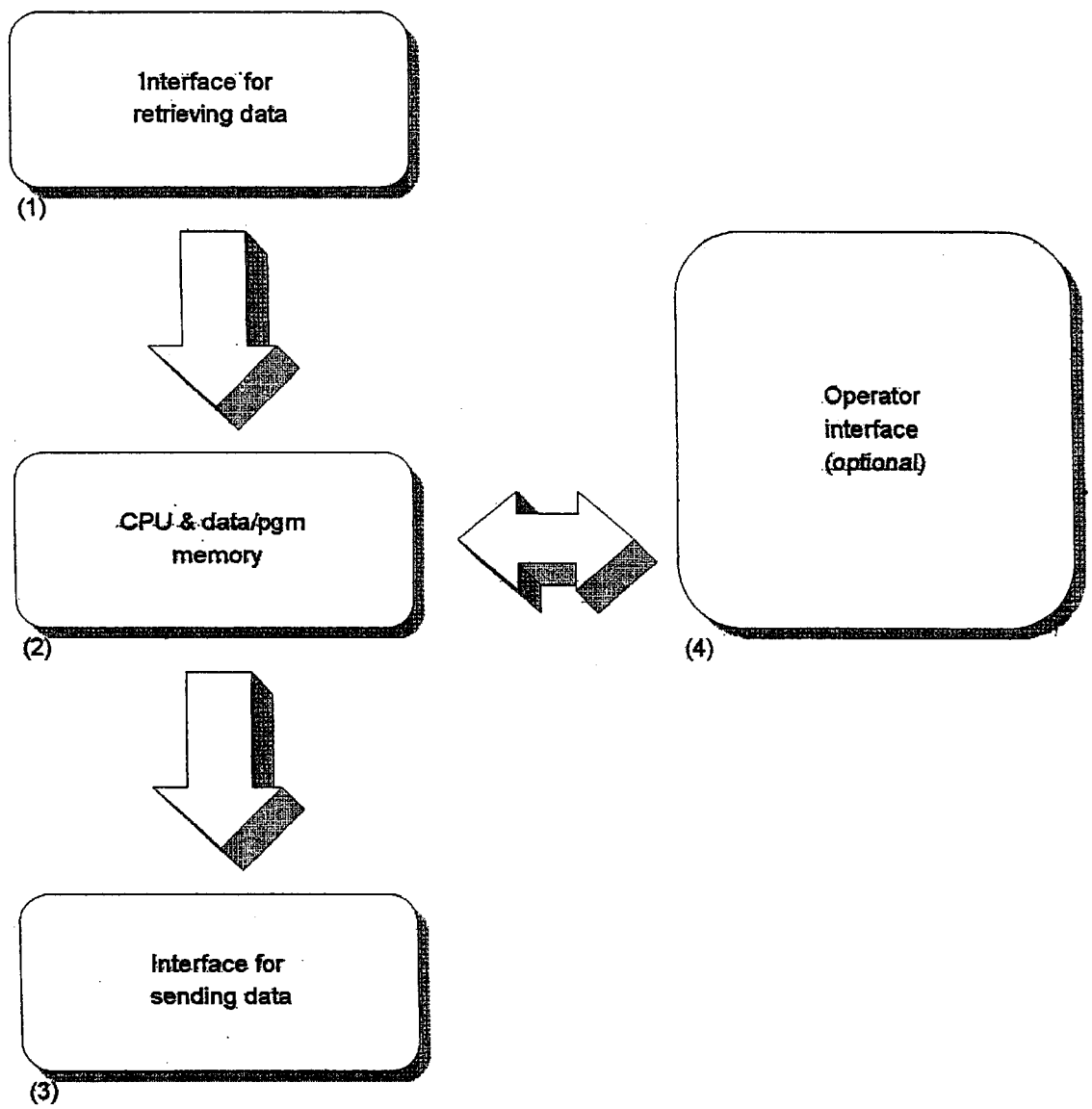
Fig 1: Hardware configuration of computing means for compression, decompression and for information density measuremnt. The requirements are essentially the same in each case.

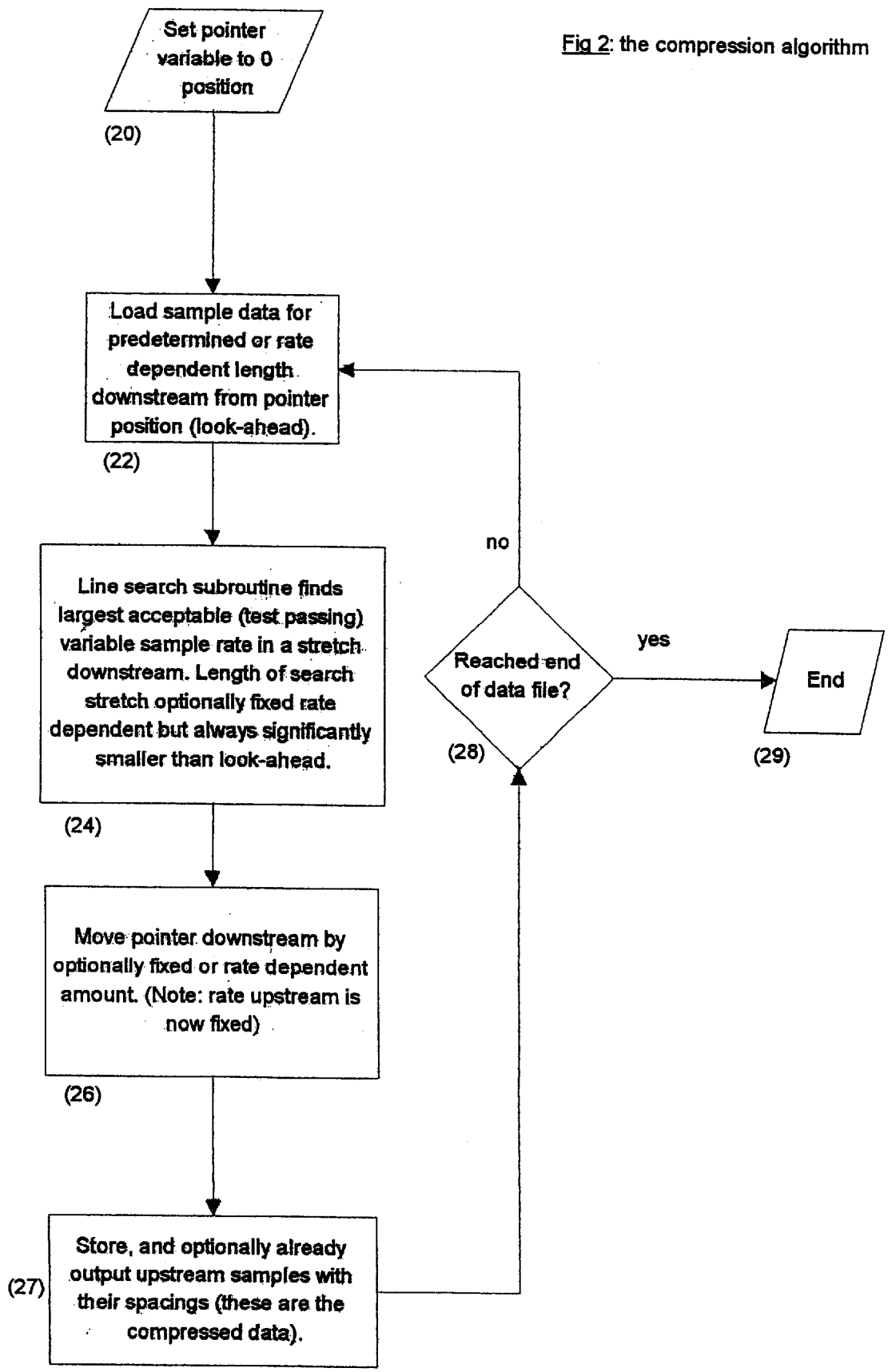
Fig 2: the compression algorithm

Fig. 4a

Example embodiment of new compression method for digitized analogue data

Programming language: *Mathematica* 4

This programming language was chosen for ease of writing, for the demonstration purpose here. Those skilled in the art will readily know how to implement this particular embodiment and all other embodiments of the algorithm as disclosed in the claims using other programming languages which are better suited for the fast processing of large amounts of data.

Load mathematica audio package:

```
<< Miscellaneous`Audio`
```

Fig. 4b

Load Shannon sampled sound file beef.wav from ftp directory:

```
beef = ReadSoundfile[
    "C:\WINDOWS\Profiles\b\Desktop\FTP-files\beef.wav", PrintHeader → True];
```

Format: Microsoft PCM WAVE RIFF

Duration: 1.02857 seconds

Channels: 1

Sampling rate: 11025

Bits per sample: 8

Data size: 11340 bytes

Number of samples: 11340

Play the sound file: (a person saying "where's the beef?")

```
pla := ListPlay[beef, SampleRate->11025,
        PlayRange->{-2^15, 2^15}]
```

Normalize the 8bit sound data:

The samples are 8 bit, though in beef they come multiplied by 256. So divide by 256 to get the amplitudes in data to range from -256 to plus 256:

```
data = beef / 256;

len = Length[data];
```

Append and prepend zeros for later use in cardinal series summation:

```
fill = Table[0, {i, 1, 256}];

data1 = Flatten[{fill, data, fill}]; data = data1; data1 =.;
```

Fig. 4c

```
lento = Length[data];
```

The data list now starts with 256 zeros, then len nonzero data, then 256 zeros, to yield a total of lento data.

Calculate the signal at all times through the cardinal series:

First, compile the cardinal series kernel:

```
ker = Compile[{x}, Sin[Pi x] / (Pi x)]
```

$$\text{CompiledFunction}\left[\{x\}, \frac{\text{Sin}[\pi x]}{\pi x}, -\text{CompiledCode}-\right]$$

Now, define the function evereywhere, via the cardinal series.

```
Do[da[m] = data[[m]], {m, 1, lento}]
```

*(Mathematica* complains about compiling the taking parts of lists, so use da[m]:)

```
f = Compile[{t}, Sum[ker[t-m] da[m], {m, Floor[t-w], Floor[t+w]}],
    {{da[_], _Integer}, {ker[_], _Real}}]
```

$$\text{CompiledFunction}\left[\{t\}, \sum_{m=\text{Floor}[t-w]}^{\text{Floor}[t+w]} \text{ker}[t-m] \, \text{da}[m], -\text{CompiledCode}-\right]$$

Note: Since the amplitude ranges, up to the sign, only over 256 values, the calculation of the amplitude at other points in time through the cardinal series needs to sum only until the contributions drop below the quantization threshold - which is here 1. Since the cardinal series goes like 1/(t-m) the calculation of the signal at some arbitrary time t requires to this precision to sum the cardinal series for at most $w = 2^8 = 256$ terms to the left and right of t.

```
w = 256;
```

Now define the signal everywhere, such that it is stored once calculated, and such that it is not being calculated if the point is an integer because then it is already in the original data file:

```
si[t7_] :=
   si[t7] = If[Abs[t7 - Floor[t7 + 0.1]] < 0.00001, da[Floor[t7 + 0.1]], f[t7]]
```

Fig. 4d

| A line search algorithm: |
|---|

Assume that the sampling times t[n] for n = 1,...,ne have been established, which is to mean that if the signal is sampled at these times, and then at the varying and finally again constant rate s = (t[ne]-t[ne-1]), 1+19/20 (s-1), 1+18/20 (s-2), ... , 1 +1/20 (s-1), 1,1,1, ...

then the reconstruction is still acceptable.

Here the t-primes of the reconstruction formula are of course to be expressed in terms of the spacings. The criterion for acceptability is to derive from the granilarity of the amplitude resolution (though it may treat differerent amplitude levels differently). Of course, the decay of the sampling rate need not be in twenty steps. The advantage of a large number of steps is that rate fluctuation artifacts are minimized. The advantage of a small number of steps is that the rate can vary more rapidly and therefore follow the signal more closely.

The key idea for speed is to keep vary the sampling points only in a designated interval and to keep them fixed in the established region and to also make sure that to the right of the test region not only is the sampling rate unchanged but also the actual sampling points are unchanged. In this way, outside the test interval in which the sampling points are being varied the values of the signal need not be permanently calculated. To the left, once calculated at the established points, they are stored, to the right, they are known since are at integer points, i.e. can be taken right from the original file. In this way, the speed turns essentially linear!

- Calculate from a proposed new spacing st the next lower spacing such that if the spacing is subsequently 20 times decremented then the new sampling lattice will hit the integers:

(Details: The endpoint of the decrease in the spacing is: Do[t[ne+i] = t[ne+i-1] + 1+(st-1) (20-i)/20,{i,0,20}] but actually that is the same as: t[ne] + 20 + (st-1) 19/2. The next-largest integer is Floor[t[ne] + 20 + (st-1) 19/2]. The initial spacing st such as to hit that integer is: (st is defned below, in the actual program, it is defined as up , equal or down from the current sampling rate s.)

```
stc := (Floor[t[ne] +20+ (st-1) 19/2] - t[ne] - 20) 2/19 +1
```

Fig. 4e

■ Calculate the next 260 new sampling points for an initial spacing stc

```
cl := Do[t[ne + i8] = If[i8 < 20,
    t[ne + i8 - 1] + 1 + (stc - 1) (20 - i8) / 20, Floor[t[ne + i8 - 1] + 1.1]],
    {i8,
    1,
    260}]
```

■ Define the test (with summing several new points to the left and right of the n'th new point):

$$\text{defzw} := \left( zw[nz\_, mz\_] := zw[nz, mz] = \frac{(-1)^{mx} (t[mz+1] - t[mz] + 0.00001)^{1/2}}{nz - t[mz] + 0.00001} \right)$$

This is a calculation for intermediate numbers often used, so to speed up the calculation, save them once calculated. However, when the lattice of new points is changed then the numbers become obsolete - so they need to be erased. Doing this with "clear" however removes along with the explicit numbers also the entire definition of zw, i.e. also how they are to be calculated. So I give this definition itself a name - and whenever the values and the definition are erased, the definition is regiven by calling defzw. This is necessary always at the beginning of a test of e new lattice: clear, then redefine zw. In the test loop the lattice is constant so the zw's calculatde in a loop are good stored and reused - speeding all up:

$$\text{test} := \left( \text{Clear["zw"]; defzw;} \sum_{n=ne-nte}^{ne+nte} \text{Floor}\left[ \text{Abs}[\text{Abs}[da[n]] - \text{Abs}\left[ \left( \sum_{v=ne-dne}^{ne+dne} zw[n,v]^2 \right)^{-\frac{1}{2}} \sum_{m=ne-dne}^{ne+dne} (zw[n,m] \, si[t[m]]) \right] \right] \right)$$

This test will yield 0 exactly if all tested reconstructed samples are deviating less than 1 from the original - it is the number of samples that differ by more than one.

Alternatively, the following test would measure the l^2 distance between original and reconstruction.

$$(* \; \text{test} := \left( \text{Clear["zw"]; defzw;} \right.$$

$$\left. \sum_{n=ne-nte}^{ne+nte} \frac{\left( \text{Abs}[da[n]] - \text{Abs}\left[ \left( \sum_{v=ne-dne}^{ne+dne} zw[n,v]^2 \right)^{-\frac{1}{2}} \sum_{m=ne-dne}^{ne+dne} (zw[n,m] \, si[t[m]]) \right] \right)^2}{2 \, nte} \right) \;\; *)$$

Fig. 4f

■ The Program steps:

Choose reconstruction checking parameters:

```
dne = 256;    (* This is the chosen range of reconstruction summations *)

nte = 10;
(* This is the range of points around ne whose amplitudes are checked *)
```

Define test-routines:

```
up := (st = 1.2 s; cl; sup = stc; test)

eq := (st = s; cl; seq = stc; test)

step := (If[up < 3, (s = sup; t[ne + 1] = t[ne] + sup; ts[ne] = 1),
    If[eq < 3, (s = t[ne] - t[ne - 1]; t[ne + 1] = t[ne] + s; ts[ne] = 0),
        (s = 1 + (stc - 1) 19 / 20; t[ne + 1] = t[ne] + s)]]; ts[ne] = -1; ne++)
```

Here, in "step", the tolerated error is specified: The choice made is that the reconstruction must not deviate from the original by more than 3 at any one of the original sampling points.

The program:

Choose from where to compress by choosing ne and setting the t[i]=i up to ne:

```
ne = 2090; Do[t[i] = i, {i, ne - 260, ne}]; s = 1;

exec := (s = t[ne] - t[ne - 1]; Do[(step; Print[N[t[ne] - t[ne - 1]] ]), {i, 1, 200}])
```

Note: I am here describing only a demosnstration of compression and decompression within the same program and machine. For this purpose it is not necessary to actually output the compressed data, i.e. the new sampling spacing and the sample values at the new sampling point, and then to retrieve them for decompression. To those skilled in the art it will be clear that all that is needed to output the compressed data is to bundle together the amplitude of the signal at the new sampling points t[n] with the data ts[ne]. Recall that the data ts[ne] are created by the line search and indicate whether the next sampling spacing goes up 20%, stays, or goes down such as to reach spacing one in 20 steps, i.e. all sample spacings are determined from these data. Of course, the three possible values for each te[ne] are not a power of two, so most efficient storing of the te[ne] data bundles more of them together, e.g. 5 of them (yielding 243 possible values) to be encoded as 8 bits (256 values).

Fig. 4g

> Plotting the original signal in an interval:

```
ti = 2000; tf = 2110;

pl := Plot[f[t], {t, ti, tf}]
```

> Reconstruct (i.e. decompress) for plotting:

The full reconstruction kernel, with the sign:

$$G[t1\_, n\_] := (-1)^{\wedge}(n + ne + 1) \, \text{Product}[\text{Sign}[t1 - t[r]], \{r, ne - rw, ne + rw\}]$$

$$\text{Sqrt}[t[n+1] - t[n]] \, (t1 - t[n])^{\wedge}(-1) \left( \sum_{r1=ne-rw}^{ne+rw} \frac{t[r1+1] - t[r1]}{(t1 - t[r1])^{\wedge}2} \right)^{-1/2}$$

$$fr[t9\_] := \sum_{n1=ne-rw}^{ne+rw} G[t9, n1] \, si[t[n1]]$$

```
rw = 21;   (* the number of summands in reconstruction calculation *)
```

> Plotting the reconstruction and the original:

```
tsn = 0.05  (* tick's absolute thickness *);

ntgr = 0.005 (* graph's relative thickness *);
```

Fig. 4h

```
plr := Plot[{fr[t3], f[t3]}, {t3, t[ne] - 11, t[ne] + 11},
  Ticks → {Join[Table[{t[i5], " ", {0, 0.025},
        {RGBColor[1, 0, 0], AbsoluteThickness[tsn]}}, {i5, ne - 5, ne + 5}],
      Table[{i6, " ", {0.025, 0}, {RGBColor[0, 0, 1], AbsoluteThickness[tsn]}},
        {i6, Floor[t[ne - 5]], Floor[t[ne + 5]]}  ]  ], Automatic},
  AxesLabel → {"t", "f(t)"}, PlotStyle → {{Thickness[tgr], RGBColor[1, 0, 0]},
    {Thickness[tgr], RGBColor[0, 0, 1]}}]
```

METHOD FOR MONITORING INFORMATION DENSITY AND COMPRESSING DIGITIZED SIGNALS

CROSS-REFERENCE TO RELATED APPLICATIONS

This Application is entitled to the benefit of Provisional Patent Application Ser. No. 60/204,174, filed May 15, 2000.

STATEMENT REGARDING FEDERALLY SPONSORED RESEARCH OR DEVELOPMENT

Not Applicable.

REFERENCE TO A MICROFICHE APPENDIX

Not Applicable.

BACKGROUND OF THE INVENTION

This invention relates to digital data processing systems which compress and decompress digitized analogue signals, such as signals from microphones or other analogue measurement devises. The invention also relates to data processing systems which analyze and monitor digitized analogue signals for diagnostic and display purposes.

Historic Background Of fundamental importance for the digital processing of analogue signals is the so-called Shannon sampling theorem. It was introduced into information theory by C.E. Shannon in the 1940's. The theorem had been known already to Borel in 1898, according to R. J. Marks II, *Introduction to Shannon Sampling and Interpolation Theory,* Springer, New York, 1991.

The sampling theorem states that in order to record an analogue signal (such as a signal from a microphone) it is in fact not necessary to record the signal's amplitude continuously. Namely, if the amplitude of the signal is recorded only at sufficiently tightly spaced discrete points in time then from these data the signal's amplitude can be reconstructed at all points in time. To this end the spacing of the sampling points is sufficiently tight if it is smaller than half the period of the highest frequency component which possesses a substantial presence in the signal. It is important to note that for Shannon sampling the spacing of the sampling times must be equidistant.

To be precise (see e.g. the text by Marks mentioned above), the reconstruction of the signal from its discrete samples works as follows: Let us denote the maximal frequency in the signal by $\omega_{max}$. Let us further denote the amplitude of the signal at time t by $f(t)$. Assume that a machine measured and recorded the amplitudes $f(t_i)$ of the signal at equidistantly spaced points in time, $t_i$, whose spacing $\Delta t = t_{i+1} - t_i$ is sufficiently small, i.e. $\Delta t < \frac{1}{2\omega_{max}}$.

Then, the amplitude of the analogue signal $f(t)$ at any arbitrary time t can be calculated from the measured values $f(t_n)$ in this way:

$$f(t) = \sum_n G(t, t_n) f(t_n) \quad (1)$$

Here, $G(t, t_n)$ is the so-called "cardinal series reconstruction kernel", or "sampling kernel":

$$G(t, t_n) = \frac{\sin[2\pi(t - t_n)\omega_{max}]}{2\pi(t - t_n)\omega_{max}} \quad (2)$$

This method of reconstructing an analogue signal's amplitude at arbitrary times from only its discretely taken samples can easily be implemented on computers—and it is of course in ubiquitous use.

Shannon Sampling Is Not Optimally Efficient

While this method, "Shannon sampling", has been of enormous practical importance, it is clearly not efficient:

When using the Shannon sampling method the highest frequency that is present in the signal determines the rate at which all samples must be taken. Namely, the larger the highest frequency in the signal the more samples must be taken per unit time. This means, in particular, that even if high frequencies occur in a signal only for short durations one must nevertheless sample the entire signal at a high sampling rate.

In practise, it is clear that the "frequency content", or "bandwidth", or "information density" of common analogue signals is not constant in time and that high frequencies are present often only for short durations. Therefore, it should normally be possible to suitably lower the sampling rate whenever a signal's information density is low and to take samples at a high rate only whenever the signal's information density is high. The Shannon sampling method, however, does not allow one to adjust the sampling rate: Shannon sampling is wasteful in that it requires one to first determine the highest overall frequency component in the signal and then, second, to maintain a correspondingly high constant sampling rate throughout the recording of the signal.

This shortcoming of Shannon sampling is important because the sampling rate of digitized analogue signals is usually the major limiting factor for the availability of network transmission speed and for computer memory capacity. Therefore, in order to use data memory and data transmission resources most efficiently, it is highly desirable to find ways to continuously adapt the sampling rate to the varying information density of the signal.

For this purpose, one needs, 1) methods and systems for measuring how a signal's information density varies in time so that one can adjust the sampling rate accordingly and, 2) methods and systems for reconstructing the signal from its so-taken samples.

Any method that allows one to sample and reconstruct analogue signals at continuously adjusted rates that are lower than the constant Shannon sampling rate amounts to a data compression method.

It would be desirable to be able to implement such a compression method purely digitally: An analogue signal that has been sampled conventionally, i.e. equidistantly (and therefore wastefully), is digitally analyized for its time-varying information density, then digitally resampled at a correspondingly time-varying sampling rate (using the cardinal series sampling formula of above), and is later decompressed by resampling it at a constant high sampling rate using a new sampling kernel that replaces the cardinal series sampling kernel and is appropriate for the case of the time-varying sampling rate.

It is clear that for such a data compression method to be most useful, the quality of the subsequent reconstruction of the signal should be controllable.

It is also clear that means or method for reliably measuring the time-varying information density of analogue signals can also be used for monitoring and displaying the information density of analogue signals. The ability to measure a time-varying characteristic of an analogue signal, such as here the signal's time-varying information density, can be of great practical value, e.g. for monitoring or diagnostic purposes, as will be explained further below.

The present invention provides corresponding methods and means.

Prior Art Techniques for Adaptive Sampling Rates

Much prior art has strived to achieve methods of sampling and reconstruction which use adaptively lower sampling rates:

Kitamura et al.

The system described by Kitamura, in U.S. Pat. No. 4,370,643 samples signals from analogue at a variable rate. The sampling rate is adjusted according to the momentary amount of change in the signal's amplitude. The reconstruction quality is not controlled. The system described by Kitamura et al., in U.S. Pat. No. 4,568,912 improves on this by reconstructing the signal as joined line segments. The inventors aim is data compression by adaptive rate sampling and also elimination of quantization noise. However, neither aim is satisfactorily achieved: Large amplitude changes of low bandwidth signals lead to inefficient oversampling rather than to the desired compression. Also, the quantization noise is not effectively eliminated since it tends to reappear in the form of jitter.

Kitamura et al., in U.S. Pat. No. 4,626,827, recognize deficiencies in their prior system. In their new system they determine the variable sampling rate by optionally either zero-crossing counting or by Fourier transforming the signal in blocks. The sampling rates are submultiples of the basic rate.

However, zero-crossing counting is a very unreliable indicator of a signal's minimum sampling rate: a signal can be very wiggly (and thus information rich) over long intervals without crossing zero at all.

The alternatively described method of establishing the minimum sampling rate by Fourier analysis of a block (or "interval", or "slice", or "period") of the signal is also unreliable. There are two main reasons:

First, there is the well-known time-frequency uncertainty relation. Second, it is known that even low bandwidth signals can be arbitrarily quickly varying in arbitrarily long intervals, and vice versa. Therefore, any method that determines a variable sampling rate by Fourier analysis of blocks of the interval is necessarily prone to uncontrolled instances of over-or undersampling.

Kitamura et al. recognize that there is a problem and try to repair these effects by sending the analogue signal before sampling through a low-pass filter which cuts off at the chosen rate, and there is a similar filter for the output. Also this is not fully satisfactory: The system still amounts to trying to do Shannon sampling for variable rates. However. since Shannon sampling requires constant sampling rates throughout there necessarily arise reconstruction errors wherever the sampling rate changes.

Podolak et al.

The system then described by Podolak et al. in U.S. Pat. No. 4,763,207 works with variable sampling rates, the rates being determined from a set of cascaded lowpass filters. The system which Podolak et al. later describe in U.S. Pat. No. 4,816,829 and U.S. Pat. No. 4,899,146 is similar but does the filtering digitally. In effect, also these systems try to use Shannon sampling for variable rates—even though it is well-known that Shannon sampling is only correct for strictly constant rates. Indeed, the authors recognize that in their system, in order to reduce uncontrollable errors, the rate must always be held constant for some rather significant length before allowing it to change again.

Similar to Podolak et al. above, Page in U.S. Pat. No. 4,755,795 describes a system in which variable sampling rates are determined by dynamic short-time bandwidth analysis. While Podolak's method keeps the sampling rate constant for significant stretches of time, Page's method leads to continuously varying sampling rates. As just discussed above, Podolak keeps the sampling rate constant in stretches because this allows Podolak to provide an approximate decompression method by using the Shannon sampling theorem, whose validity is restricted to constant rates. Page, due to his method's continuously varying sampling rates cannot use the Shannon sampling theorem for decompression. Indeed, Page is silent on how to decompress, i.e. on how to reconstruct the original signal with controllable error from samples taken at a varying rate.

Johnson et al.

Johnson et al., in U.S. Pat. No. 5,302,950 then describe a system for automatic detection of a signal's minimum constant sampling rate. This invention works with constant sampling rates and the scope of this invention is merely to provide users with information about memory versus quality options in recording sessions. The determination of the minimum sampling rate is optionally by zero-crossing counting or by block-wise Fourier transform.

Johnson et al., in U.S. Pat. No. 5,543,792 then build on this method. They describe a system which does data compression again by effectively doing Shannon sampling at block-wise constant rates. This system therefore too suffers from the above mentioned deficiencies. In particular, for the reconstruction purposes this system establishes a common time base of the various rates used. This is to fill in, i.e. to restore the samples previously dropped in the compression process. However, it is known that the reconstruction of lost samples requires some significant oversampling—because the reconstruction of lost samples is numerically highly unstable under small perturbations.

In addition, their methods of zero-crossing counting or Fourier transform in blocks for the purpose of determining the sampling rate suffers again of the above mentioned deficiencies. The system also does not provide control over the quality of the reconstruction.

In Johnson et al., U.S. Pat. Nos. 5,610,825 and 5,893,899 the authors add a system for informing users of potential information loss through undersampling. However, the method is not measuring the actual reconstruction quality. Instead, it merely compares the actual sampling rate to a theoretical rate. The theoretical rate is determined again by methods such as Fourier transform in blocks, the reliability of which is limited due to the above mentioned reasons.

Systems Using Psychoacoustic and Psychovisual Effects

Systems of the type described e.g. by Anderson in U.S. Pat. No. 5,388,181 utilize peculiarities of human perception, i.e. certain psychoacoustic and psychovisual effects. These methods compress data by dropping such information the loss of which humans are normally not likely to perceive. Such systems are limited to analogue signals which are audio or video signals, and among these only to those signals for which high quality reconstruction is inessential. Due to their loss of information such compression systems are unsuitable, e.g., for the compression of most medical and scientific analogue signals.

Prior Art Which Measures Signals' Variable Information Density for Monitoring and Diagnostic Purposes Methods for measuring a signal's varying information density are useful not only for data compression purposes.

Methods for measuring a signal's varying information density can also be a valuable tool for the technical and medical monitoring of the source of the analogue signal:

For example, it has been found that often characteristics of sounds emitted by machines change shortly before the machine fails. Similarly, much effort is put into the analysis and monitoring of seismic signals for changes which might indicate imminent quakes. The monitoring of signal characteristics has also proven useful in medical applications, for example in efforts to predict epileptic seizures from patients' EEG signals. Current methods and applications are described, e.g., in L. Cohen, Time-frequency analysis, Prentice Hall, 1995.

In prior art, methods which monitor signals by measuring the signals' varying information density use the same approaches as discussed before in the context of data compression, such as zero crossing counting and various windowed Fourier transforms. These methods therefore possess the same deficiencies as discussed above in the context of data compression.

Limitations of Prior Art

To summarize, prior art methods and systems do not reliably measure the analogue signals' time-varying information density. Therefore, prior art does not provide means or methods for optimally adjusting the sampling rate to the varying information density of signals. Therefore, prior art adaptive rate sampling does not yield efficient data compression. Prior art also does not provide efficient means or methods for decompressing data sampled at varying rate because prior art does not allow the user to satisfactorily control the amount and type of compression loss, namely, prior art does not allow the user to satisfactorily control the amount of possible deviation of the decompressed signal (i.e. of the reconstructed signal) from the original signal.

BRIEF SUMMARY OF THE INVENTION

The present invention comprises a digital method for measuring a digitized analogue signal's varying information density. This part of the invention can stand alone, i.e. it alone is already useful. Namely, it provides a new method for monitoring how an important characteristic of analogue signals, namely their information density, varies over time. This monitoring ability can be useful both for technical and medical diagnostic purposes.

Based on this method for measuring the variable information density of signals, the present invention further comprises a digital method for compressing and decompressing digitized analogue signals. Namley, according to the present invention, 1) a signal's samples taken conventionally at a constant high rate are input, 2) the signal's time-variable information density is measured digitally, 3) the signal is numerically resampled from these samples taken at the constant high sampling rate to samples at a continuously variable lower sampling rate which corresponds to the measured time-varying information density and 4) those lower rate samples (and the rate information) are output as the compressed data. 5) The invention also provides a method for reconstructing the original signal from this output by using a new sampling kernel that replaces the usual cardinal series sampling kernel.

It is an object of the invention to thereby provide a method for approaching the theoretical limit of compression. It is a further object of the invention that it provides the user with full control over the amount and type of lossyness of the compression, i.e. over the quality of the reconstructed signal.

According to the present invention, the time-varying information density of analogue signals is measured by applying a line search algorithm. This new method has the important advantage that the sampling rate is adjusted truly continuously, thus adjusting optimally to the signal and avoiding the block boundary artifacts of prior art. The line that the algorithm searches for is the maximum sample spacing as a function of time. In the line search algorithm, trial time-varying sampling rates are systematically tried out and labeled acceptable if, for the signal at hand, an acceptance criterion calculated from the signal and the trial sampling rate is met. A preferred embodiment of a line search algorithm is explicitly given.

Also, several explicit embodiments of acceptance criteria are given. The preferred embodiment of an acceptance criterion is the criterion whether the reconstruction with a preferred choice of reconstruction kernel yields a reconstructed signal of predetermined maximum deviation from the original signal. This embodiment has the important advantage that it provides the user with full control over the amount of lossiness of the compression. The invention allows the use of arbitrary choices of functions $G(t,t_n)$ as the reconstruction kernel for time-varying sampling rates. A preferred choice of $G(t,t_n)$ is presented, which is optimal according to the present inventor's analysis. The line search outputs the lowest time-varying sampling rate that meets the acceptance criterion. The compression can be iterated, e.g. with successive levels of required reconstruction quality applied to the difference between the original and the reconstructed signals of the previous compression step.

For the underlying idea, please see the section "Theory of Operation", below.

BRIEF DESCRIPTION OF THE FIGURES

FIG. 1 shows the hardware configuration of the computing means for compression, decompression and information density measurement.

FIG. 2 shows the compression algorithm.

FIG 4 is a program listing with preferred embodiments of essential features of the invention. The program listing carries its own documentation.

DETAILED DESCRIPTION OF THE INVENTION

The Compression

Figure 3A:
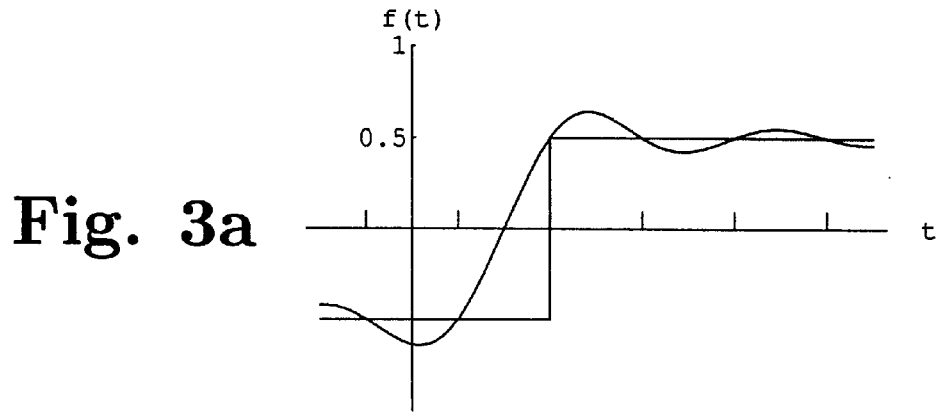
FIG. 3 gives the example reconstruction of a simple but important type of signal: the step function. The invention and conventional Shannon sampling are compared, demonstrating the great efficiency gain through the invention.

According to the present invention, computing means for compression comprise a CPU, memory for data, memory for programs—which may comprise both RAM and ROM—interfaces to import and export data, and optionally an interface for user control, such as a display and keybord.

The computing means for compression receive an analogue signal in conventionally digitized form, i.e. in the form of equidistantly sampled amplitude data. The computing means for compression process the signal by implementing the following algorithm as a computer program in a convenient programming language:

A pointer variable denotes the region of the signal which is currently being compressed, and this pointer's value successively increases from initially denoting the beginning to finally denoting the end of the signal. At any given time the computing means for compression need to retrieve and store only a sufficient number of signal data up- and downstream from the pointer value. Sufficient data are as many as are needed to allow the convergence of the reconstruction kernel summations described below to converge up to a predetermined precision. For on-the-fly operation there is therefore a short look-ahead.

As a subroutine, a line search routine is implemented. The line searched is the optimal sample spacing as it varies along the signal.

The line search routine tests variable trial sampling rates in a region of either predetermined or of rate-dependent length downstream from the point currently designated by the pointer variable. As mentioned above, this stretch is to be chosen small enough as compared to the strech of original signal data currently loaded. This stretch is small enough if in the line search region the values of the signal are computable up to desired precision via the cardinal series reconstruction kernel from the original signal data currently loaded. The line search routine outputs the lowest variable sampling rate which passes an acceptance test.

When a line search ends, data representing the so-found optimal sampling rate are stored and the pointer is moved forward. It is moved forward by an amount such that the subsequent line search then applies to a stretch of the signal which is further downstream but which still possesses significant overlap with the stretch of the preceding line search. Thus, upstream of the pointer value the sampling rate is then fixed. Samples taken upstream, at this optimally low variable rate, together with data describing the samples' variable spacing can be output as soon as produced, i.e. whenever the pointer variable moves, or a posteriori. Those are the compressed data. The compression as a whole, may also be iterated. For example, successive compressions can be applied to the difference between the original and the reconstructed signal of the prior compression, thereby enforcing increasing reconstruction quality.

The invention offers users to choose any desired compromise between the processing speed and the level of resolution of the information density: The larger the overlap of successively line searched stretches the finer and therefore better the varying information density is being resolved. On the other hand, choosing a smaller overlap of successive line searches allows faster processing of the signal.

This user choice also affects the achievable compression ratio: The larger the overlap is chosen and therefore the finer the information density is resolved, the fewer samples need to be taken. However, this also means that more data are needed to specify the varying sampling rate. In the preferred embodiment an intermediate size overlap is implemented and the number of lines searched in the line search is restricted such that a small number of bits suffice to describe the variations of the sampling spacing.

In principle any arbitrary line search algorithm (many are known) can be used. The preferred embodiment is explicitly given in FIG. 4. In the preferred embodiment, the line search simply tries to increase the previously adopted spacing for the interval immediately prior to the pointer for the next spacing by a predetermined number N of positive and negative trial percentages, the trial increase being sustained for a predetermined number R of samples, followed by relaxing the spacing from there to the original sample spacing within a predetermined number, e.g. 20, of successive samples. In FIG. 4, the prefered embodiment is presented for R=1 in the form of the enclosed program listing. The finding of the largest acceptable trial variable sampling rate then terminates the line search and the result is stored by storing which of the N trial sampling rate changes has been accepted for the M samples. Consequently, the cost for storing the sampling spacing information is merely $\log_2 N$ bits per M new samples.

However, this particular line search subroutine is only one embodiment and of course any one of the many known textbook line search routines or its variations may be used as the line search subroutine. The test upon which the line search subroutine is to decide the acceptance of a trial sampling rate is one of the following: In one embodiment, the acceptance test used by the line search routine is the criterion whether the error of reconstruction of the signal from the lower rate is below a predetermined threshold. To this end, the signal is computationally reconstructed by numerically resampling it from samples spaced at the trial rate. Recall here that Shannon sampling, which resamples using the cardinal series reconstruction kernel, i.e. which uses the sinc-function kernel, is not suitable for this purpose because Shannon sampling applies only to equidistantly spaced samples.

According to the present invention, any function $G(a, b)$ of two variables can be used as the kernel in the reconstruction computation: $f(t)=\Sigma_n G(t,t_n) f(t_n)$. However, the quality of the achievable compression strongly depends on the choice of reconstruction kernel for the reconstruction from samples which are nonequidistantly spaced.

The preferred choice of reconstruction kernel is:

$$G(t, t_n) = \frac{\sqrt{s(t_n)} \left( \prod_{j \neq n} \mathrm{sign}(t - t_j) \right)}{t - t_n} \left( \sum_k \frac{\sqrt{s(t_k)}}{(t - t_k)^2} \right)^{-1/2}$$

Here, the $t_n$ are the (now nonequidistant) sampling points. The function s is $s(t_n)=t_n+1-t_n$ in the preferred embodiment. Alternatively, s can be any measure of the spacing around the point $t_n$, as described in more detail below. Equivalent expressions for this kernel will be given below. According to the author's analysis, the reconstruction kernel above allows one to approach optimal compression. (Note that in the special case of equidistant sampling spacing this preferred kernel reduces indeed to the conventional cardinal series kernel).

The evaluation of the acceptance test then consists in computing any one of the usual measures for the difference between two signals. in this case between the original and the reconstructed signal. The test results in acceptance of the trial line if the error is smaller than some predetermined value, i.e. if the numerical reconstruction meets a predetermined level of precision. In the preferred embodiment the difference between original and reconstructed signal is measured by the number of original sampling points within the current stretch, at which the original signal's and the reconstruction's amplitude differ by more than a predetermined amount. In the preferred embodiment this test is set to yield acceptance only if this number is zero. As a consequence, the preferred embodiment has the advantage that its operation guarantees that the reconstructed, i.e., the decompressed signal at no sampling point differs more than a predetermined amount from the original.

In a second embodiment, the acceptance test used by the line search sub routine is the criterion whether an alternating sum of samples with weighted coefficients, or "weighted alternating sum", when taken at the trial rate, is consistently close to zero. Here, the sum is consistently close to zero if it is close to zero in all of a predetermined number computations of the weighted alternating sum for samples taken at the rate given by the trial line, but with different sampling points. The quality of the compression depends on the choice of the precise form of this weighted alternating sum. The preferred choice of formula for the weighted alternating sum improves upon the Fourier series by making it suitable for use with nonequidistantly spaced samples; it is the following formula:

$$\sum_n (-1)^n \sqrt{t'_n}\, f(t_n)$$

Here, $t'_n$ is any measure of the spacing around the point $t_n$. In the preferred embodiment it is simply $t'_n = t_{n+1} - t_n$.

In alternative embodiments of acceptance tests a combination of both of the above acceptance tests can be chosen: The former test has the advantage of providing absolute control over the reconstruction quality. The latter test has the advantage of being computationally fast. Both advantages can be utilized for example by implementing the fast test for initial rough stages of the line search and the fully controlled test for the fine-tuning in final stages of the line search.

The Decompression

According to the present invention, computing means for decompression comprise a CPU, memory for data, memory for programs—which may comprise both RAM and ROM—interfaces to import and export data, and optionally an interface for user control, such as a display and keybord.

The computing means for decompression operate by implementing the following algorithm as a computer program is a convenient programming language: The algorithm consists in numerically resampling the signal at a high constant rate from the compressed data. To this end again any function $G(t, t_n)$ as a generalized reconstruction kernel for nonequidistantly spaced samples can be used. For anyone skilled in the art it is of course very easy to implement the numerical resampling of the signal at a constant high rate by numerically implementing $f(t) = \Sigma_n G(t, t_n) f(t_n)$ as a computer program, for whatever choice of $G(t, t_n)$.

In the preferred embodiment $G(t, t_n)$ is the same kernel as was used for the compression. If the data have been compressed without using a reconstruction kernel for nonequally spaced samples, e.g. by using the second above mentioned test for the line search, of if the nonequally spaced samples have been obtained by different methods, e.g. by methods of prior art, then the present invention allows users to decompress these data as if they were obtained by using the method which uses a reconstruction kernel for nonequally spaced samples, as disclosed above. In this case, the preferred reconstruction kernel for the decompression is the one disclosed in the above equation.

The Information Density Measurement

According to the present invention, computing means for the measurement of signals' information density comprise a CPU, memory for data, memory for programs—which may comprise both RAM and ROM—interfaces to import and export data, and optionally an interface for user control, such as a display and keybord.

The method of measuring the variable information density of signals for monitoring and display purposes consists of identical steps as the above described method of data compression. Only, in this case, the output consists merely of the data which describe the optimally low, variable, sampling rate.

Advantages

The invention has the advantage that it provides a much improved method for measuring the time-varying information density of digitized analogue signals. It therefore provides improved tools for monitoring sources of analogue signals. The invention can be particularly useful for example for medical and technical diagnostic purposes, such as e.g. for the prediction of machine failure through machine sound monitoring.

The invention has the further advantage that, based on the new method for measuring the time-varying information density of signals, it provides an improved method for the compression and decompression of digitized analogue signals. The compression method has the advantage to provide means for approaching the theoretical limit of compression. The invention therefore allows the user to more efficiently use the resources of computer memory and network capacity.

A further advantage of the invention is that it provides the user with full control over the lossiness of the compression, i.e. over the quality of the reconstructed signal: Indeed, the invention has the advantage that the user can choose seamlessly from lossless to lossy compression. The user can even choose both the amount and the type of tolerated compression loss a feature which is particularly useful when the quality of the decompressed signal is essential, as e.g. in medical applications, where uncontrolled reconstruction artifacts could lead to misdiagnoses.

DESCRIPTION OF THE FIGURES

FIG. 1 shows the hardware configuration of the computing means for compression, decompression and information density measurement. These are essentially the same for all three:

The computing means comprise a CPU, fast RAM memory for data, disk and fast RAM or ROM memory for programs. These receive and output data through an interface or port device which are able to communicate with external data storage, external computer net-works or external real-time data acquisition (such as from A/D samplers) or real-time data postprocessing (such as to D/A converters or to displays). The computing means comprise, optionally, also an interface for human intervention, e.g. through display and keyboard. E.g. a human operator may wish to influence the settings for the tolerated lossyness of the compression. On the other hand, the invention can also be embodied in an entirely hardwired form, with all options preset. In this case, the program which implements the compression, or the decompression or the informations density measurement, may be stored in ROM memory. As such, the various ramifications of the invention can be incorporated into recording devices and into replaying devices and into monitoring devices, where they can operate on-the-fly, i.e. essentially real-time, up to a short delay due to the required short look-ahead and processing time.

FIG. 2 shows the compression algorithm: In box 20, a pointer variable is set to zero. The pointer variable will always point to the position up to which the signal has been compressed. In Box 22, sample data, i.e. the equidistantly taken samples of the to be compressed signal are loaded for a finite length downstream. The length of this look-ahead can be predetermined fixed or rate-dependent, as will become clear after we return to box 22 from the algorithm. Box 24 contains a line search algorithm which finds—among the lines which this particular line search considers—the line which describes the largest generally variable sampling spacing in a stretch downstream from the pointer, the length of the stretch being predetermined or rate-dependent. This optimal rate is stored. In box 26, the pointer is moved downstream by a predetermined or rate-dependent amount. The sampling rate upstream from the pointer is now fixed up to the pointer. In Box 27 those upstream data are stored. For on-the-fly operation, samples taken upstream at the now established lower sampling rate, together with data that describe those samples' spacing can already be output. These are the compressed data. In box 28 the pointer is checked for having reached the end of the to be compressed signal's data file. If not, the algorithm proceeds to box 22, otherwise the algorithm reaches box 29. If the compressed data have not already been output on the fly, in box 17, then they are to be output now with the end of the algorithm in box 29. As mentionen above, the compression may be iterated. In this algorithm its speed and its capability of resolving details of the varying sampling rate clearly depend on how far downstream the line searched stretch is chosen, and on how far the pointer is moved downstream after each line search. Processing speed can obviously be increased by making these lengths about proportional to the sampling rate in the stretch considered. It is important to note that in all embodiments the look-ahead is chosen sufficiently larger than the line searched stretch. This is because the line search obviously requires the computation of sample values through the cardinal series, and the look-ahead must be long enough so that the series can be summed up to the required predetermined numerical precision.

Any one of the numerous textbook line search routines or their variations may be used in this compression algorithm. A simple but concrete embodiment is here disclosed as an accompanying program listing. Those skilled in the art will readily be able to implement the above compression algorithm with efficient line search routines in programming languages that are adapted to the fast numerical processing of large amounts of data. The line search finds for the considered downstream stretch the largest variable sampling spacing line which passes an acceptance test. I here disclose two basic types of test, with combinations being possible. An embodiment of the test is implemented in the enclosed program listing, FIG. 4.

Description of the Method for Measuring and Monitoring Signals' Varying Information Density It is clear that the same figure, FIG. 2, can describe also the working of the disclosed method for measuring the information density of signals for the purpose of monitoring the sources of analogue signals. The operation is identical, up to the single point that the data to be output are merely the data which describe the variable sampling rate. This is because the varying sampling rate is by itself already the desired measure for the information density of the signal: Where the sampling rate is large, the information density is low and vice versa. Clearly, the varying sampling rate output can be visualized on displays or serve as the input of monitoring postprocessing.

Description of the Decompression Method

The decompression of the compressed data, i.e. of a file which contains sample amplitudes together with data which indicate the spacings at which these samples where taken, works as follows: A file is created of conventional, i.e. of equidistant samples of the signal. This is achieved by computing the reconstructed signal at a high equidistant sampling rate from the nonequidistantly spaced samples by using a reconstruction kernel $G(t, t_n)$. If the signal was compressed using in the line search the first of the two tests, then the reconstruction kernel used in this test is the preferred kernel also for the decompression. If the data were not compressed in this way (i.e. either by using the second test, or even by using some other compression method that yields nonequally spaced samples and their spacing as its output) then the preferred reconstruction kernel is the one which has been explicitly disclosed above. The implementation of the numerical resampling of the signal from the unequally spaced data using the generalized sampling kernel is similar to the familiar Shannon sampling and those skilled in the art will therefore not require explanation in an extra flow chart.

Figure 3B:
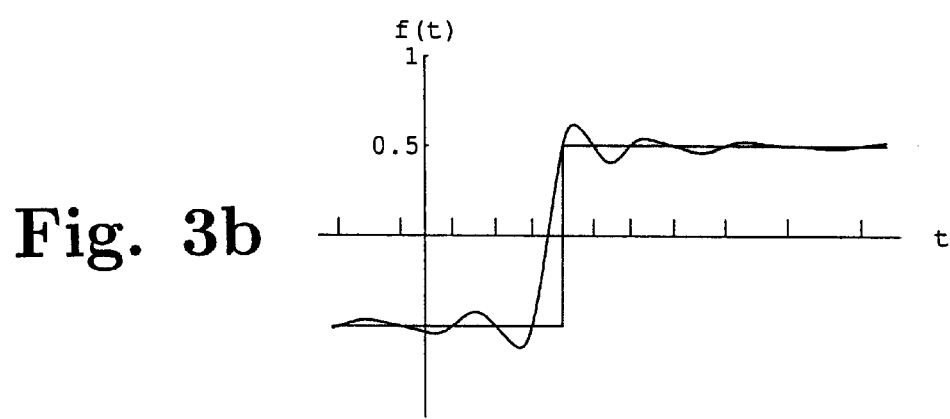
Figure 3C:
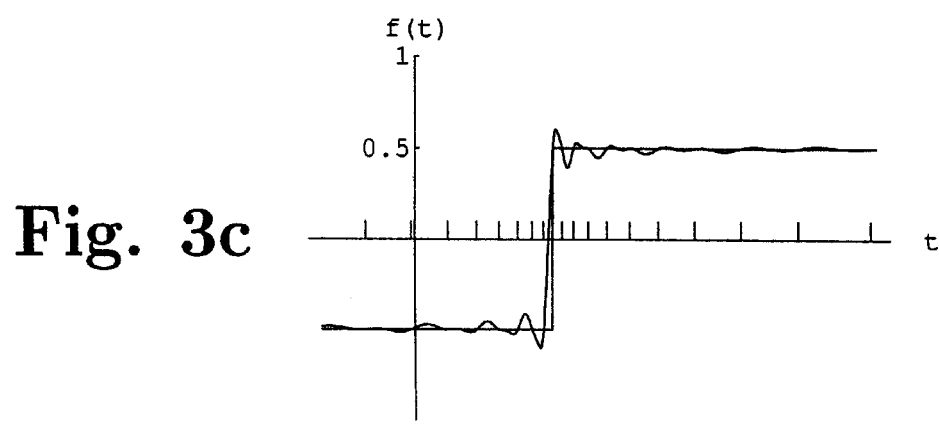
Figure 3D:
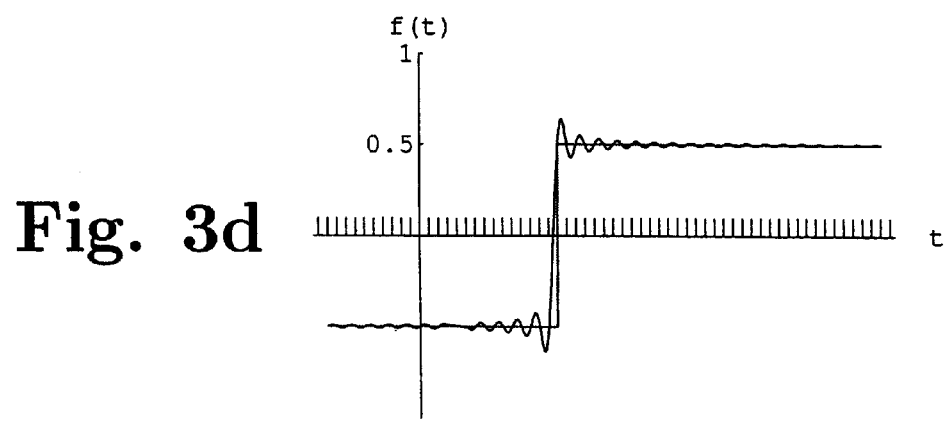

FIG. 3 shows four graphs. The four graphs of FIG. 3 illustrate how the new sampling method handles the worst case scenario, namely the step function (which is of course not bandlimited at all). FIG. 3 demonstrates the large efficiency gain through the invention. Each graph of FIG. 3 shows in red the original signal, i.e. the step function. The ticks on the time axis indicate a choice of points at which the original signal is being sampled. The reconstruction of the signal is then made by using the preferred reconstruction kernel. The reconstructed functions are shown in blue.

1. The first graph, 3*a,* shows the result at a constant low sampling rate. Since the sampling rate is constant this case is ordinary Shannon sampling. Clearly, since the sampling rate is low, only the low frequency components of the step are properly captured and this leads to a poor reconstruction of the signal. One recognizes the Gibbs phenomenon.
2. In second graph, 3*b,* the flexibility provided by the new sampling method is used to choose a three times higher sampling rate close to the step while away from the step the sampling rate decreases down to the same sampling rate as in the first graph. We see that the increased sampling rate close to the step already improves the reproduction of the signal.
3. In the third graph, 3c, the sampling rate close to the step is chosen 10 times higher than the rate in the first graph. Again, away from the step, the sampling rate is chosen to linearly decrease down to the rate of the first graph. The reproduction is further improved.
4. In the fourth graph, 3*d,* the 10-fold sampling rate is chosen throughout the time axis. Since the sampling rate is now constant this is again ordinary Shannon sampling, with the expected result.

We can now compare the third with the fourth graph: The sampling rate used in the third graph is everywhere on the time axis only a tenth of the sampling rate used in the fourth graph, apart from a small region close to the step. Thus much fewer samples are needed in the third graph. Nevertheless, one sees that the reproduction of the original signal is in both graphs of comparable quality. It is clear that the new method as applied in the thrid graph does indeed increase sampling efficiency, namely by allowing comparable quality reconstruction from a highly reduced number of samples.

FIG. 4 is the program listing with a preferred embodiment. The listing carries its own documentation.

CONCLUSION, RAMIFICATIONS, AND SCOPE

The present invention, through new techniques for determining signal's time-varying information density overcomes the limitations of prior art such as the above described limitations of zero-crossing counting or such as blockwise, or "windowed" Fourier transforming. The invention thereby yields a powerful new method for measuring a crucial time-varying characteristic of signals, namely a signal's time-varying information density.

The output, display and possible further processing of the time-varying information density of a signal can be useful in numerous contexts. For example, it can serve as an indicator of changes in the process that produces the analogue signal, e.g. for the purposes of monitoring machine noises to predict machine failure, or also for the monitoring of human vital functions for diagnosis or predictions, such as predictions of seizures from EEG's.

The present invention also provides new techniques for the compression and decompression of digitized analogue signals by adaptively lowering the sampling rate. The invention provides for a technique that utilizes truly continuously varying sampling rates, thereby allowing optimal adaptation of the sampling rate to the signal, namely by utilizing not the cardinal series sampling kernel but instead sampling kernels that are adapted to varying sampling rates.

This invention is not to be construed as limited to the particular preferred embodiments, since these are regarded as illustrative rather than restrictive. Moreover, variations and changes may be made by those skilled in the art without departing from the spirit of the invention.

Theory of Operation

Prior art methods to compressing analogue data such as speech or music by reducing the sampling rate have focussed on the idea that the "bandwidth" of signals can vary in time, and that therefore it should be possible to choose a variable sampling rate accordingly. In practice it is clear what is meant by a variable bandwidth, and it is clear that some form of data compression along these lines should be possible. However, progress in this direction has been hampered by a simple but important fact: The concept of bandwidth requires Fourier analysis. Fourier analysis, however, requires equidistant samples.

Much prior art has therefore been devoted to inventing methods that use blockwise constant sampling rates so as to be able to use conventional Shannon sampling within each block. However, since Shannon sampling strictly requires constant sampling rates, there then necessarily arise significant errors due to the finite size of these blocks.

The new invention solves the original problem. Namely, it provides a method to continuously adjust the sampling rate to the information density of the signal. To this purpose, the invention does not use Fourier methods. Instead, the starting point is to directly address the main goal: the measurement of the information density and the compression of data:

I propose that the true reason why typical signals are compressible when equidistantly sampled is not to be found with any Fourier based concept of variable bandwidth. Instead, the reason why most signals are compressible is the following:

In some regions of typical signals, neighboring samples will be strongly correlated while in other regions neighboring samples will be less correlated. For example: if a machine records only one sample per second from a music recording, then neighboring of those samples will be essentially uncorrelated. If, however, the machine takes $106^6$ samples per second then the music signal changes little from one sample to the next, and therefore neighboring of those samples will be strongly correlated.

As is clear, however, correlated data can be compressed. Indeed, maximally compressed data are maximum entropy data. This is because if a signal is not maximum entropy and therefore possesses residual correlations among its data then these correlations could be exploited for further compression.

Therefore, in regions of a signal where equidistantly sampled neighboring samples are strongly correlated, compression is possible: to this end one can simply take fewer samples. This is because, as mentioned, wider spaced samples are less correlated.

The basis of the present data compression method is therefore the idea to increase the sample spacing to a time-varying degree throughout the signal, up to just before the samples start to become uncorrelated. The so-obtained variable spacing is then inversely proportional to the information density of the signal.

In order to measure the correlation of the samples taken at a trial sampling rate, a machine can compute the above mentioned weighted alternating sum of samples: By the central limit theorem, in any fixed interval the weighted alternating sum has the same normal distribution independently of how the samples are spaced—if these samples are uncorrelated. For strongly correlated samples the alternating sum is essentially zero. Therefore, by computing the alternating sum for a trial sampling rate, a machine can test whether the signal is still compressible, namely by testing whether the samples are correlated: In this case, the weighted alternating sum is consistently essentially zero. Consistently essentially zero means that the sum will be essentially zero, i.e. only of the order of the average amplitude, no matter which set of sampling points with the trial spacing is considered. To exclude the case of a mistaken acceptance due to the sum for uncorrelated samples being accidentally zero, it is therefore preferred to run this test several times for each trial sampling rate line, each time choosing slightly different sampling points which obey the spacing indicated by the trial line. Since the calculation of the weighted alternating sum is computationally fast, even repeating the calculation a few times is still computationally fast.

After establishing a lower variable sampling rate in this way, the question is which reconstruction kernel applies. A mathematical result obtained by the inventor shows that the preferred reconstruction kernel, namely $$G(t, t_n) = \left( \prod_{|m|<N, m \neq n} (t - t_m) \right) \left( \sum_{|r|<N} \frac{t'_r}{t'_n} \prod_{|s|<N, s \neq r} (t - t_s)^2 \right)^{-1/2},$$

reconstructs signals so that the alternating weighted sum indeed essentially zero. Here the $t_n$ are the generally non-equidistantly spaced sampling points. The definition of the $t'_n$ is as follows: As with Shannon sampling, also here, there is not only one set of sampling points which have the optimal spacing: There is a whole family of sampling grids, or one-dimensional sampling lattices, which all have the optimum variable spacing. These grids differ essentially only by translation from another. One can parametrize the shifting from one optimum spacing sampling grid to the next by a continuous parameter, say $\alpha$, so that the sampling points are now parametrized: $t_n(\alpha)$. Then, $t'_{nl} = dt_n(\alpha)/d\alpha|_{\alpha=0}$. The details of the parametrization are irrelevant because any overall factor for the $t'_n$ drops out of both, the calculation of the weighted alternating sum and the calculation of the reconstruction kernel.

While this is the theoretical and strictly correct expression, in practice, a simple approximation can often be used: It is clear that $t'_n$ is essentially the sampling spacing at $t_n$. Thus, as long as one does not attempt to resolve the information density to a precision on the order of a few sampling spacings, it is numerically satisfactory to simply set $t'_n$ equal to the lattice spacing pre or post $t_n$, or any type of average of the two. However, when the information density is to be resolved to high precision, e.g. for monitoring purposes, or in order to achieve highest compression, then the line search subroutine is to compute the $t'_n$ as the derivative of the line that is searched up to the precision to which this derivate makes sense, i.e. up to the precision to which the line is being resolved.

Crucially, the knowledge of the reconstruction kernel opens up a powerful new way of measuring the information density: The measurement of the signal's information density through the calculation of the weighted alternating sum is based on statistics. Namely, the algorithm distinguishes a zero sum from a sum that is gaussian distributed. Given the reconstruction kernel, it becomes possible to entirely avoid the uncertainties of statistics and arrive at full control over the measurement of the information density: Namely, the machine can directly compare the signal reconstructed from the samples taken at the trial rate with the original signal.

If one were to restrict the new compression method by allowing the use only of constant sampling rates, then one would recover Shannon sampling: The preferred weighted alternating sum then simplifies to become a Fourier series. Also, the preferred reconstruction kernel then simplifies and becomes the Shannon theorem's cardinal series sinc-function reconstruction kernel.

What I claim is my invention is:

1. A method for digitally measuring the time-vying information density of digitized analogue signals, comprising the steps of
    a) providing hardware for digital data input and output, memory and processing,
    b) inputting data representing an analogue signal sampled at a constant sampling rate,
    c) performing a line search on the data,
        wherein the line searched for is the lowest accepted time-varying sampling rate,
        wherein the acceptability test of trial rates consists in testing whether the numerical reconstruction of the signal by using a predetermined reconstruction kernel $G(t,t_n)$ meets a predetermined precision, and
    d) outputting said lowest acceptable time-varying sampling rate,
whereby said lowest acceptable time-varying sampling rate represents a measure of a time-varying characteristic of the signal, namely its time-varying information density, which is useful for technical and medical diagnostic purposes.

2. The method of claim 1 wherein said reconstruction kernel is given by $$G(t, t_n) = \left(\prod_{|m|<N, m\neq n} (t - t_m)\right) \left(\sum_{|r|<N} \frac{t'_r}{t'_n} \prod_{|s|<N, s\neq r} (t - t_s)^2\right)^{-1/2}$$

with predetermined definition of the $t'_n$.

3. A method for compression of digitized analogue signals by
    a) using the method of claim 2,
        whereby said lowest acceptable time-varying sampling rate is found,
    b) numerically resampling the signal at the time-varying sampling rate, and
    c) outputting the data representing the samples taken at this rate, together with the data representing said lowest acceptable time-varying sampling rate,
whereby these output data constitute the compressed signal.

4. A method for compression of digitized analogue signals by
    a) applying the method of claim 3 iteratively to the difference between the signal and its reconstruction,
        whereby the achievable compression can be optimized by applying in the iteration successively stringent predetermined acceptance tests,
    b) outputting the data representing the samples taken at this rate, together with the data representing said lowest acceptable time varying sampling rate, for each step of the iteration,
whereby these output data constitute the compressed signal.

5. A method for compression of digitized analogue signals by
    a) using the method of claim 1,
        whereby said lowest acceptable time-varying sampling rate is found,
    b) numerically resampling the signal at the time-varying sampling rate, and
    c) outputting the data representing the samples taken at this rate, together with the data representing said lowest acceptable time-varying sapling rate,
whereby these output data constitute the compressed signal.

6. A method for compression of digitized analogue signals by
    a) applying the method of claim 5 iteratively to the difference between the signal and its reconstruction,
        whereby the achievable compression can be optimized by applying in the iteration successively stringent predetermined acceptance tests,
    b) outputting the data representing the samples taken at this rate, together with the data representing said lowest acceptable time-varying sampling rate, for each step of the iteration,
whereby these output data constitute the compressed signal.

7. A method for the decompression of signals from their nonequidistantly spaced samples to equidistantly spaced samples, by
    a) providing hardware for digital data input and output, memory and processing,
    b) inputting data representing an analog signal's samples $f(t_n)$ at nonequidistantly spaced times $\{t_n\}$,
    c) numerically resampling the signal at predetermined equidistantly spaced times by using the formula $f(t) = \Sigma_n G(t,t_n)f(t_n)$ where the sampling kernel G is given by $$G(t, t_n) = \left(\prod_{|m|<N, m\neq n} (t - t_m)\right) \left(\sum_{|r|<N} \frac{t'_r}{t'_n} \prod_{|s|<N, s\neq r} (t - t_s)^2\right)^{-1/2}$$

d) outputting the equidistantly spaced samples,
whereby said equidistantly spaced samples constitute the decompressed signal.

8. A method for decompression of signals which were compressed by resampling at time-varying sampling rates iteratively for successive differences between the original and the reconstructed signal, by
    a) providing hardware for digital data input and output, memory and processing,
    b) inputting the compressed signal data,
    c) numerically resampling each step of the iteration from its varying sampling rate to a predetermined constant sampling rate, utilizing a predetermined sampling kernel G,
    d) adding up the iteratively obtained amplitudes,
    e) outputting the equidistantly spaced samples,
whereby the equidistant samples of the original signal are the decompressed signal.

9. The method for decompression of claim 8,
    wherein the sampling kernel G is $$G(t, t_n) = \left(\prod_{|m|<N, m\neq n} (t - t_m)\right) \left(\sum_{|r|<N} \frac{t'_r}{t'_n} \prod_{|s|<N, s\neq r} (t - t_s)^2\right)^{-1/2},$$

whereby the equidistant samples of the original signal constitute the decompressed signal.

10. A method for digitally measuring the time-varying information density of digitized analogue signals, comprising the steps of
   a) providing hardware for digital data input and output, memory and processing,
   b) inputting data representing an analogue signal sampled at a constant sampling rate,
   c) performing a line search on the data,
      wherein the line searched for is the lowest accepted time-varying sampling rate,
      wherein the acceptability test of trial rates consists in testing whether the weighted alternating sum of signal samples $\Sigma_n f(t_n)(-1)^n \sqrt{t'_n}$ is consistently essentially zero for samples taken at the trial rate,
      wherein the $t'_n$ are obtained by a predetermined function from the trial rate,
   d) outputting said lowest acceptable time-varying sampling rate,
whereby said lowest acceptable time-varying sampling rate represents a measure of a time-varying characteristic of the signal, namely its time-varying information density, which is useful for technical and medical diagnostic purposes.

11. A method for compression of digitized analogue signals by
   a) using the method of claim 10,
      whereby said lowest acceptable time-varying sampling rate is found,
   b) numerically resampling the signal at the time-varying sampling rate, and
   c) outputting the data representing the samples taken at this rate, together with the data representing said lowest acceptable time-varying sampling rate,
whereby these output data constitute the compressed signal.

* * * * *